United States Patent [19]

Barker et al.

[11] Patent Number: 4,698,104

[45] Date of Patent: Oct. 6, 1987

[54] CONTROLLED ISOTROPIC DOPING OF SEMICONDUCTOR MATERIALS

[75] Inventors: Robert A. Barker, Mountain View; Chuang C. Tsai, San Jose; John C. Knights, Palo Alto, all of Calif.

[73] Assignee: Xerox Corporation, Stamford, Conn.

[21] Appl. No.: 18,769

[22] Filed: Mar. 2, 1987

Related U.S. Application Data

[63] Continuation of Ser. No. 678,946, Dec. 6, 1984, abandoned.

[51] Int. Cl.$^4$ ............................................. H01L 21/385
[52] U.S. Cl. ...................................... 437/141; 437/247
[58] Field of Search ............... 148/186, 187, 188, 174; 29/576 W

[56] References Cited

U.S. PATENT DOCUMENTS

| | | | |
|---|---|---|---|
| 3,502,517 | 3/1970 | Sussmann | 148/175 |
| 3,576,685 | 4/1971 | Swann et al. | 148/187 |
| 4,226,898 | 10/1980 | Ovshinsky et al. | 148/1.5 X |
| 4,317,844 | 3/1982 | Carlson | 204/164 X |
| 4,348,428 | 9/1982 | Rockley et al. | 427/85 X |
| 4,353,086 | 10/1982 | Jaccodine et al. | 29/576 W |
| 4,362,766 | 12/1982 | Dannhauser et al. | 148/188 X |
| 4,375,124 | 3/1983 | Cogan | 148/188 X |
| 4,389,255 | 6/1983 | Chen et al. | 148/188 X |
| 4,465,529 | 8/1984 | Arima et al. | 148/188 |
| 4,472,212 | 9/1984 | Kinsbron | 148/188 |
| 4,493,740 | 1/1985 | Komeda | 148/187 |
| 4,569,701 | 2/1986 | Oh | 148/188 |

OTHER PUBLICATIONS

Hackh's Chemical Dictionary, 4th Edn., 1965, N.Y., p. 363. QD 5.H3.

Primary Examiner—George T. Ozaki
Attorney, Agent, or Firm—Serge Abend

[57] ABSTRACT

A method of doping selected areas of semiconductor material in the fabrication of integrated circuit devices, including placing a semiconductor substrate in a glow discharge reactor, introducing reactant gases into the reactor, subjecting the reactant gases to a plasma discharge, depositing, upon the substrate, a dopant carrier layer comprising an amorphous semiconductor material having a predetermined dopant concentration, controlling the thickness of the dopant carrier layer, and driving the dopant atoms out of the amorphous semiconductor dopant carrier layer into the selected areas of the semiconductor substrate by means of a controlled elevated temperature anneal.

14 Claims, No Drawings

CONTROLLED ISOTROPIC DOPING OF SEMICONDUCTOR MATERIALS

This is a continuation of application Ser. No. 678,946, filed Dec. 6, 1984, now abandoned.

This invention relates to an improved method for the accurate controlled doping of semiconductor materials over a range of concentrations, which may extend to eight orders of magnitude. As our method is isotropic, it thereby extends the accurate control of dopant concentration to trench and mess sidewalls in IC devices.

In IC fabrication, a semiconductor substrate, such as silicon, germanium, or a III-V compound, e.g. gallium arsenide, is subjected to a series of chemical and thermal treatments which modify the electrical properties of certain well-defined areas. More specifically, the electrical characteristics of these areas are a function of impurity (dopant) concentrations, i.e. a net concentration of electron donor impurity atoms or a net concentration of electron acceptor impurity atoms, as well as the final profile of the impurity concentration. By diffusing the electrically active impurity atoms into the selected areas of the substrate to the desired depth, the electrical characteristics are also controlled. In this manner, source and drain regions in MOS devices and bases, emitters and resistors in bipolar devices are formed. It should be understood that in order to obtain exactly reproducible concentration profiles, the dopant concentration, and the diffusion temperature and time all must be strictly controlled.

Several methods are presently available for introducing dopant atoms into senicondutor substrates. Each has its advantages and shortcomings in controlling the dopant concentration, obtaining uniformity and reproducibility, doping side walls, and ability to process large numbers of device wafers in a batch, for reducing manufacturing costs. These methods are: (a) diffusion from a chemical source in a vapor film, (b) diffusion from a doped-oxide source, and (c) diffusion and annealing from an ion implanted source.

Most commonly, diffusion from a chemical source in a vapor form, or chemical vapor deposition (CVD), is typically carried out in atmospheric or reduced pressure modes. In both modes, the preparation of doped polycrystalline semiconductor thin films, while marginally adequate for non-critical, high concentration (e.g. 5 to 10%) uses, is incapable of accurate and uniform control at low concentrations. It is well known that the rates of thermal decomposition of silane, and its common dopants, phosphine, diborane and arsine are different. With the substrate being maintained at a given temperature, within the furnace tube, decomposition of the gases, and the resultant deposition upon the substrate, will be non-uniform. Thus, as the reactant gases flow through the tube they will be depleted at different rates therealong, resulting in a position dependency of deposition thicknesses on the stacked wafers. Non-uniformity of deposition thickness across the plane of the wafer has been reported in a recently published article entitled "Phosporous-Doped Polycrystalline Silicon via LPCVD" authored by B. S. Meyerson et al, appearing in the October 1984 issue of the *Journal of the Electrochemical Society: Solid-State Science and Technology*, at pages 2361–2365. In this article, Meyerson et al indicate that the addition of dopant (2.5% phosphine) to the silane LPCVD process results in suppression of film deposition rates by over an order of magnitude, and severe non-uniformity in thickness of the films and phosphorus content across the plane of the wafer. The lack of uniform deposition control described relative to the CVD process, also extends to doping by diffusion from a doped-oxide source, (furnace glass deposition).

Ion implantation technology, on the other hand, has the capability of precisely controlling the number of implanted dopant atoms and their depth distribution profile. Ionized-projectile atoms are introduced into substrate targets with enough energy to penetrate beyond surface regions. Therefore, this process is routinely used in VSLI fabrication, and replaces chemical vapor deposition and doped-oxide techniques, for dopant control in the $10^{14}$ to $10^{18}$ atoms/cm$^3$ range. However, as the implantation is damaging to the semiconductor crystal structure, a corrective thermal annealing step is required, which further drives dopant.

In substantially all cases, IC processing requires the etching of regions of the substrate to form windows and trenches through which dopant is implanted. Often the etched side walls must also be doped. Clearly, an isotropic doping process is required for the side walls. The above-described chemical processes are isotropic whereas the ion implantation process is anistropic. A dilemma presents itself to the IC designer, the chemical processes are capable of doping the side walls but cannot precisely control low dopant concentrations, while ion implantation can precisely control low dopant concentrations but due to its line-of-sight deposition characteristic, side walls will be shadowed.

Therefore, it is the primary object of the present invention to provide a highly controllable, isotropic, semiconductor doping method capable of uniformly implanting precise dopant levels over an extremely large range of dopant concentrations, e.g. eight orders of magnitude. In particular, the proposed method enables extremely low doping concentrations, comparable to ion implantation techniques.

The present invention, for doping selected areas of semiconductor material in the fabrication of integrated circuit devices, may be carried out, in one form, by placing a semiconductor substrate in a glow discharge furnace, introducing reactant gases into the furnace for forming a semiconductor film including a predetermined concentration of dopant, creating a plasma within the furnace, depositing a carrier layer of doped semiconductor material, in its amorphous form, upon the substrate, controlling the thickness of the layer, and driving the dopant atoms out of the amorphous semiconductor layer into the semiconductor substrate by means of a controlled elevated temperature anneal.

We have made the startling discovery that by marrying aspects of crystalline semiconductor technology with those of the amorphous semiconductor technology, a novel method for the precisely controlled doping of crystalline semiconductor integrated circuit devices has been made possible. These two technologies, have historically followed their own developmental paths which have not crossed one another. Hybrid processes were beyond the purview of those working in these fields, primarily because of the thermal incompatibility of the materials. Temperatures encountered in standard crystalline processing are necessarily higher than that which would change the metastable amorphous form to the crystalline form. We have been able to bring the paths together to advantageously provide an inexpensive, highly controllable, doping method for crystalline semiconductors.

Dopant incorporation for varying the conductivity of predetermined device areas, is clearly an indispensible step in the fabrication of crystalline semiconductor integrated circuits. As set forth above, where precision is not required and high concentrations are satisfactory, the methods of choice have been gas phase furnace diffusion (CVD) and furnace glass deposition, both of which are carried out at relatively high temperatures. On the other hand, where high precision at low concentrations is needed, the more expensive ion implantation technique has been chosen.

It is also well known to accurately dope amorphous semiconductor materials for controlling their conductivity, as needed for various applications, such as FETs, phototransistors, solar cells, etc. This is accomplished by the decomposition of appropriate reactant gases, for example, silane ($SiH_4$) for amorphous silicon or germane ($GeH_4$) for amorphous germanium, to which have been added small amounts of donor or acceptor doping gases, for example phosphine ($PH_3$), diborane ($B_2H_6$) or arsine ($AsH_3$). Preferably, decomposition is by a plasma assisted CVD process, wherein the plasma provided by R.F. power is capacitively coupled into the gas in a parallel plate arrangement. Energy for decomposing the gases for film deposition is provided by the plasma, and not a heated substrate, thus enabling the process to be accomplished at low temperature, e.g. in the range of approximately 20° C. to 600° C.

In our unique process, the first step involves uniform deposition of a carrier layer of doped amorphous semiconductor material, of appropriate thickness and dopant concentration, to provide the desired number of dopant atoms to preselected, patterned areas of the underlying crystalline semiconductor material. No dopant will be driven into the underlying material during the deposition step, since the plasma deposition step is inherently accomplished at a low temperature. Therefore, since the temperature is sufficiently low to preclude decomposition of the reactant gases at their inherently different decomposition rates, and deposition relies solely upon the plasma energy, the dopant composition throughout the carrier layer will be relatively uniform. The next step is to drive the dopant out of the amorphous layer and into the crystalline semiconductor material by an appropriate elevated temperature anneal. This second step will drive the dopant atoms to the desired depth. By separating the deposition step from the driving step, we are able to obtain a highly accurate dopant profile.

After the standard crystalline semiconductor device has been suitably patterned and etched to define device areas, doping of those portions may be accomplished. The following are two typical examples of the processing steps we have used, and their parameters, for practicing our unique invention. In both instances we start out with readily available prediluted dopant gases, with concentrations varying from about 50 ppm (0.005%) phosphine, diborane or arsine in silane, to about 20% of the appropriate dopant in silane.

EXAMPLE I

We desire to dope the predetermined areas of the substrate with about 0.3 ppm of boron. The patterned semiconductor substrate is loaded into a parallel plate glow discharge reactor having anode and cathode plates approximately 5 inches in diameter and separated by approximately 1 inch. The pressure within the reactor is reduced to 0.1 Torr. Pure silane and prediluted 100 ppm diborane in silane are metered into the glow discharge reactor in a ratio of 99:1 with the total flow of the reactant gases being 150 sccm. The substrate temperature is maintained at 25° C. and RF power of 2 Watts at 13.56 MHz is capacitively coupled into the gas. The RF plasma decomposes the reactant gases which, in about 1.6 minutes, deposit on the substrate as a 100 Å thin carrier layer of boron doped amorphous silicon including 1 ppm boron (0.0001%). Because of the low deposition temperature, substantially all of the dopant will remain in the film, none being driven into the substrate. Diffusion of the boron dopant atoms into the preselected areas of the substrate is then effected by elevating the substrate temperature to 1000° C. for 15 minutes in an argon atmosphere. About one-third of the dopant atoms in the carrier layer, or 0.3 ppm of boron, will be driven into the substrate.

EXAMPLE II

We desire to dope the predetermined areas of the substrate with about 500 ppm of boron. The steps of Example I are followed, with the only change being the metering of reactant gases. Pure silane and prediluted 1% diborane in silane are metered into the glow discharge reactor in a ratio of 85:15. The resultant thin film amorphous silicon carrier layer includes 1500 ppm boron, of which 500 ppm will be driven into the substrate during the subsequent diffusion step.

Dopant concentration is readily achievable over a range of about eight orders of magnitude by "loading" the desired number of dopant atoms into the carrier layer. At one end of this continuum, a mixture 0.1 ppm (parts per million) dopant in silane (equivalent to 0.00001%) may be used to deposit a carrier layer of amorphous silicon 20 Å thick. Such a layer will yield $1 \times 10^9$ dopant atoms/$cm^3$. Of these, about one-third, or $3 \times 10^8$ atoms/$cm^3$, are expected to be effectively driven into the crystalline semiconductor substrate. At the other end of this continuum, a mixture of 200,000 ppm dopant in silane (equivalent to 20%) may be used to deposit a layer of amorphous silicon 2000 Å thick. The number of dopant atoms available in this film is $2 \times 10^{17}$/$cm^3$. Similarly, about one-third, or $6 \times 10^{16}$ atoms/$cm^3$, may effectively be driven into the underlying crystalline semiconductor material.

After the carrier has served its primary purpose, it may be either removed or retained as a passivating layer. By oxidizing the depleted carrier layer it may be converted to $SiO_2$. For example, wet oxidation of the wafer at 1000° C. for 15 minutes in a hydrogen and oxygen mixture will convert it to silicon glass. A wet etch in a 10:1 HF solution was then used to remove this oxide layer. Conversion to $SiO_2$ makes it easy to differentially strip the layer from the underlying crystalline silicon substrate, since the etching process will be self limiting. Alternatively, the substrate with the depleted carrier layer thereon could have been subjected to a controlled plasma etch and removed thereby. On the other hand, it would be possible, if desired, to retain the oxidized carrier layer as an encapsulant.

In comparison to the very high cost of ion implantation equipment presently required for precise doping control, the cost to implement our unique process in most IC processing environments would be incremental, since no additional equipment need be purchased. The standard plasma etcher and the standard plasma enhanced silicon nitride deposition equipment are essentially the same as the capacitively coupled glow discharge CVD equipment which we use. Only the reactive process gases need be changed and the deposition parameters, of temperature, flow rate, time and pressure need be tuned.

We are able to provide a solution to a problem heretofore not readily remediable. In standard IC processing, during the formation of circuit features, selective removal of the substrate will form multiple levels therein.

Thus, there are "vertical" side walls between "horizontal" surfaces at different levels. (The terms horizontal and/or vertical surfaces or walls refer to the direction in relationship to the major surface of the sbstrate.) For simplicity of description, the vertical surfaces will all be termed trench walls. While dopant diffusion and implantation are commonly used to change the conductivity of preselected horizontal surfaces, it is often also desired to dope the trench walls. This becomes important when these walls have defects which can act as shorting paths between device features on different horizontal levels. Appropriate doping would passivate them.

Ion implantation is incapable of trench wall doping, as it is a line-of-sight process, and the trench walls inevitably will be shadowed. In devices which are so large that the trench walls are sloped, the result of shadowing is substantially less doping thereon than on the horizontal surfaces. However, as device features shrink to micron and sub-micron dimensions, it is imperative that trench walls be vertical. These cannot be implanted at all.

Having described our unique process, it should be noted that glow discharge CVD deposition of the doped amorphous semiconductor carrier layer is isotropic. This characteristic allows us to dope trench walls with the accuracy of dopant concentration control comparable to horizontal surface deposition. No known process to date has satisfactorily accomplished this task.

It should be understood that the present disclosure has been made only by way of example and that numerous changes in materials and process parameters may be resorted to without departing from the true spirit and the scope of the invention as hereinafter claimed.

What is claimed is:

1. A method of doping selected areas of semiconductor material comprising the steps of
   providing a substrate of semiconductor material having areas to be doped, said areas including contours comprising trenches and mesas,
   then depositing, by means of plasma enhanced low pressure chemical vapor deposition, a predetermined thickness of a dopant carrier layer of amorphous semiconductor material including a predetermined amount of dopant therein, upon the substrate areas to be doped, the dopant carrier layer being substantially uniformly deposited to the same thickness over all the contours, said step of depositing being carried out at a temperature in the range of 20° C. to 600° C. so as to prevent the dopant from being driven out of said dopant carrier layer and into said areas to be doped, and subsequently
   driving the dopant out of the carrier layer and into said areas to be doped in a controlled manner by annealing the substrate at a elevated temperature for a time sufficient to cause a predetermined amount of the dopan to enter said areas to be doped.

2. The method of doping selected areas of semiconductor material as defined in claim 1 characterized in that said step of depositing comprises metering reactant gases in a predetermined ratio for obtaining a predetermined concentration of dopant atoms in the dopant carrier layer and controlling the thickness of the dopant carrier layer for obtaining a predetermined amount of dopant atoms in the dopant carrier layer.

3. The method of doping selected areas of semiconductor material as defined in claim 1 characterized in that said step of driving is accomplished by annealing the substrate at an elevated temperature on the order of 1000° C.

4. The method of doping selected areas of semiconductor material as defined in claim 1 characterized by the further step of removing the depleted dopant carrier layer.

5. The method of doping selected areas of semiconductor material as defined in claim 4 characterized in that said step of removing comprises plasma etching the depleted dopant carrier layer.

6. The method of doping selected areas of semiconductor material as defined in claim 4 characterized in that said step of removing comprises converting the depleted dopant carrier layer to an oxide layer and then differentially wet etching away the oxide layer.

7. The method of doping selected areas of semiconductor material as defined in claim 1 characterized by the further step of converting the depleted dopant carrier layer to a passivating layer.

8. The method of doping selected areas of semiconductor material as defined in claim 1 characterized by providing a substrate of crystalline semiconductor material.

9. The method of doping selected areas of semiconductor material as defined in claim 1 characterized in that the semiconductor material is crystalline silicon, and the dopant is selected from the group consisting of boron, phosphorus and arsenic.

10. The method of doping selected areas of semiconductor material as defined in claim 1 characterized in that said dopant carrier layer is amorphous silicon.

11. The method of doping selected areas of semiconductor material as defined in claim 1 characterized in that said dopant carrier layer is amorphous germanium.

12. The method of doping selected areas of semiconductor material as defined in claim 10 or 11 characterized in that the dopant is selected from the group consisting of boron, phosphorus and arsenic.

13. A method of doping selected areas of semiconductor material comprising the steps of
   providing a substrate of semiconductor material having areas to be doped,
   then depositing, upon the substrate areas to be doped, a predetermined thickness of a dopant carrier layer of either amorphous silicon or amorphous germanium including a predetermined amount of dopant atoms therein, said dopant being selected from the group consisting of boron, phosphorus and arsenic, the dopant carrier layer being substantially uniformly deposited to the same thickness over all contours of the substrate, including trench and mesa sidewalls, said step of depositing being carried out at a temperature in the range of 20° C. to 600° C. so as to prevent the dopant from being driven out of said dopant carrier layer and into said areas to be doped, and subsequently driving the dopant atoms out of the carrier layer and into said areas to be doped, said step of driving being accomplished by annealing the substrate at a temperature on the order of 1000° C. for a time sufficient to cause a predetermined amount of the dopant to enter said areas to be doped.

14. The method of doping selected areas of semiconductor material as defined in claim 13 characterized by the further step of removing the depleted dopant carrier layer.

* * * * *